United States Patent [19]

Awaji

[11] Patent Number: 4,658,145
[45] Date of Patent: Apr. 14, 1987

[54] SOLID STATE RELAY

[75] Inventor: Hidekazu Awaji, Kashihara, Japan

[73] Assignee: Sharp Kabushiki Kaisha, Osaka, Japan

[21] Appl. No.: 814,160

[22] Filed: Dec. 23, 1985

Related U.S. Application Data

[63] Continuation of Ser. No. 528,658, Sep. 1, 1983, abandoned.

[30] Foreign Application Priority Data

Sep. 2, 1982 [JP] Japan ................................. 57-153617

[51] Int. Cl.$^4$ ............................................ H01J 40/14
[52] U.S. Cl. ............................ 250/551; 250/214 SW; 307/252 B; 307/311
[58] Field of Search ............ 250/551, 214 R, 214 SW, 250/239; 307/252 B, 252 T, 311; 357/72, 74

[56] References Cited

U.S. PATENT DOCUMENTS 4,309,605  1/1982  Okabe .................................. 250/239
4,443,712  4/1984  Gokita ............................. 307/252 B Primary Examiner—Edward Westin
Attorney, Agent, or Firm—Birch, Stewart, Kolasch & Birch

[57] ABSTRACT

A solid state relay includes a diode for emitting light, a photothyristor circuit responsive to the light from the diode for turning on and outputting a first output signal, the photothyristor circuit having two photothyristors connected to each other in parallel in an opposing direction and a triac circuit responsive to the photothyristor circuit for turning on and outputting a second output signal.

4 Claims, 7 Drawing Figures

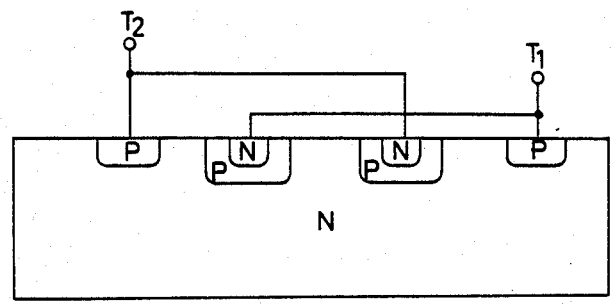
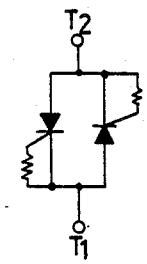
FIG.3(b)   FIG.3(a)
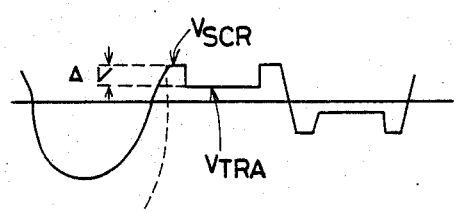
FIG.4
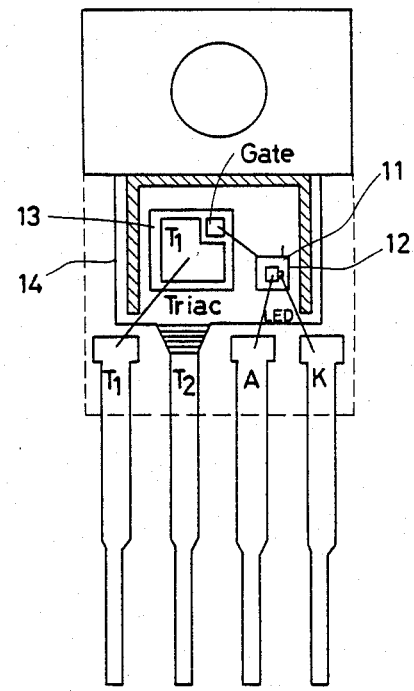
FIG.5

SOLID STATE RELAY

This application is a continuation of application Ser. No. 528,658 filed on Sept. 1, 1983, now abandoned.

BACKGROUND OF THE INVENTION

The present invention relates to an improvement of a solid state relay, more particularly, to a solid state relay using a light coupling between a light emitting element and a light receiving element.

As FIG. 1(a) shows, a conventional solid state relay generally comprising a photocoupler 1 for coupling between input and output terminals in an electrical isolation condition, a bridge circuit for rectifying by supplying the output of the photocoupler 1, and a trielectrode AC switch (TRIAC) 3 to which the ouput of the bridge circuit is supplied. For example, in FIG. 1(a), a light emitting diode 5 of the photocoupler 1 emits light by inputting input signals, so that a photothyristor 6, coupled optically to the light emitting diode 5, turns on. When the photothyristor 6 turns on, a current flows to the gate of the TRIAC 3, so that the TRIAC 3 turns on, and outputs signals in response to the input signals. As the photothyristor 6 is operated only with a half wave cylce, a rectifier stack 2 is added in the solid state relay. Further, a limit resistance $R_1$ and a snubber circuit comprising a resistance $R_3$ and a capacitor C for the prevention of a TRIAC malfunction are provided in the TRIAC 3.

In the above state relay, discrete components for constructing the above circuit are provided on a glass epoxy resin substrate 4 as shown in FIG. 1(b), and each of the elements of the discrete components is electrically connected to each other in accordance with the circuit of FIG. 1(a). The discrete components on the substrate 4 are then coated by the epoxy resin.

As described above, the conventional solid state relay requires many circuit components, so that the shape of it is large and a wide space for packaging it in any electric apparatus is required. Furthermore the assembly such as electrical connections, takes a long time. Accordingly, the reliability of the assembled circuit as a solid state relay is low.

SUMMARY OF THE INVENTION

An object of the present invention is to simplify an improved solid state relay circuit.

Another object of the present invention is to provide an improved solid state relay using a light coupling between a light emitting element and a light receiving element, eliminating the above problem.

Still another object of the present invention is to provide an improved solid state relay comprising photothyristors provided in parallel in an opposing direction to feed the current in both directions.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to an embodiment of the present invention, a solid state relay comprises diode means for emitting light, photothyristor means responsive to the light from the diode means for turning ON and outputting a first output signal, the photothyristor circuit comprising at least two photothyristors connected to each other in parallel in an opposing direction and triac means responsive to the photothyristor means for turning on and outputting a second output signal.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIGS. 3(a) and 3(b) show a diagram of an essential part of the circuit and a sectional view of a semiconductor substrate for the circuit of FIG. 2, respectively;

FIG. 4 shows a voltage waveform for explaining the conventional solid state relay; and FIG. 5 is a packaged construction of an embodiment of a solid state relay according to the present invention.

DETAILED DESCRIPTION OF THE INVENTION

Figure 2:
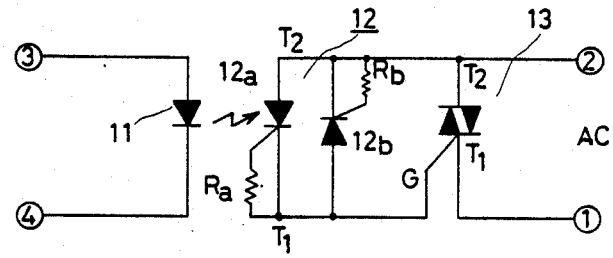
FIG. 2 is a circuit diagram of an embodiment of a solid state relay according to the present invention.

FIG. 2 is a circuit diagram of an embodiment of a solid state relay of the present invention. The solid state relay of FIG. 2 comprises a light emitting diode 11, a photothyristor circuit 12 coupled with the light emitting diode 11, and a TRIAC 13. The TRIAC 13 is connected to the photothyristor circuit 12 in order to output signals in response to input signals to the light emitting diode 11.

As FIGS. 2 and 3(a) show, the photothyristor circuit 12 comprises photothyristors $12_a$ and $12_b$ having internal gate resistances $R_a$ and $R_b$, respectively, connected to each other in parallel and opposing direction, so that the current flows in both directions. The photothyristor circuit 12 of FIG. 3(a) is assembled in the semiconductor substrate as shown in FIG. 3(b). Two P-type regions and two N-type regions are diffused in a N-type semiconductor substrate, and the above regions having internal gate resistances are connected in parallel in the opposing direction.

Because the photothyristor circuit 12 comprises the photothyristors $12_a$ and $12_b$ connected in parallel in the opposing direction, the current can flow in both directions. Accordingly, the bridge rectifier circuit for the conventional solid state relay, can be eliminated.

The above embodiment of the present invention does not show the zero-crosssing function. When a solid state relay showing the zero-crossing function is required, a circuit having the zero-crossing fuction can be added and assembled on the same substrate with photothyristors $12_a$ and $12_b$.

The ON voltage of the TRIAC 13 connected to the photothyristor circuit 12 is set smaller than the ON voltage of the photothyristor circuit 12 in consideration of a specific resistance, a diffusion pattern and a construction of the photothyristor circuit 12.

Figure 1A:
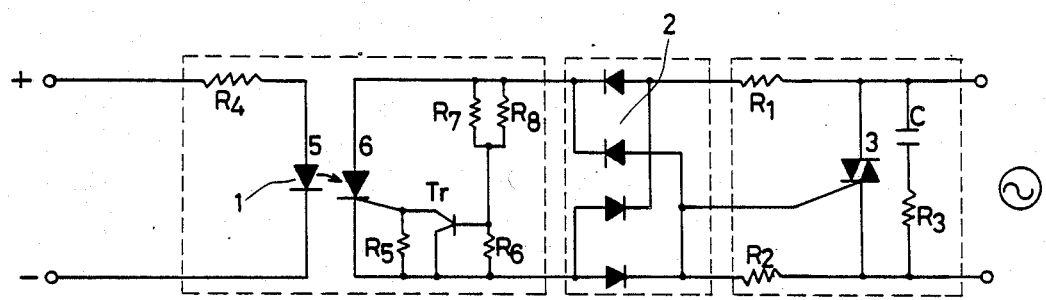
FIG. 1(a) is a circuit diagram of the conventional solid state relay.
Figure 1B:
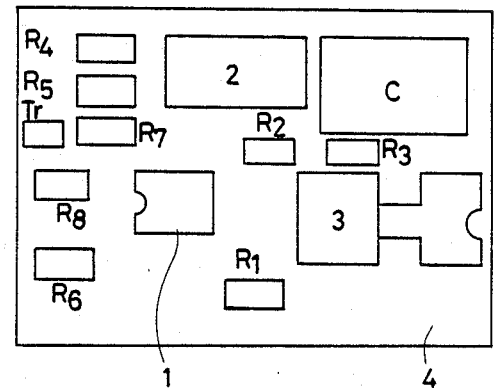
FIG. 1(b) shows a packaged construction of the conventional solid state relay of FIG. 1(a)

In the conventional relay of FIG. 1, the limit resistance $R_1$ is additionally provided to prevent the photothyristor from being destroyed by the inrush current when the TRIAC 3 is on, and the resistance $R_1$ is smaller than 100Ω. But, when the limit resistance $R_1$ is provided, in addition, the voltage waveform of the solid state relay varies by the amount of the resistance drop voltage (ΔV) attributed to the difference between the ON voltage $V_{SCR}$ of the photothyristor 6 and the ON voltage $V_{TRA}$ of the TRIAC 3 as shown in FIG. 4. Further, when the solid state relay is operated by a current which is smaller than the minimum driving current of the TRIAC 3, the ON voltage of the solid state relay is high, and a voltage supplied to a load is decreasd as such, so that the operation of the load becomes poor.

However, in the present invention as shown in FIG. 2, the ON voltage of the photothyristor circuit 12 is set higher than the ON voltage of the TRIAC 13, and the gate resistance $R_2$ of the TRIAC 13 is removed, so that the TRIAC 13 turns on by a gate trigger current produced when the photothyristor circuit 12 turns on.

Responsive to the conductance of the TRIAC 13, at the same time, the photothyristor circuit 12 turns off. Because of this, even if an inrush current is applied on the photothyristor circuit 12, the TRIAC 13 turns on after the period of about 10 μs, and the current does not flow to the photothyristor circuit 12.

The circuit of the solid state relay as shown in FIG. 2 is packaged by the TO packaged construction as shown in FIG. 5. The TRIAC 13 is die bonded on the broadly header 14 from which heat can escape. The photothyristor circuit 12 is die bonded on the remaining region of the header 14. The light receiving face of the photothyristor circuit 12 is directed to the upper surface side of FIG. 5. The light emitting diode 11 is coupled with the photothyristor circuit 12 via a light-transmittance insulator such as glass or the like. After each of the above elements is electrically connected by a wire or the like, the solid state relay is completed by a transfer mold. The fundamental elements of the above solid state relay can be constructed by semiconductor elements.

Though the above embodiment of the present invention is explained as an AC driving solid state relay, a DC driving solid state relay can be constructed also by incorporating a power transistor.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A solid state relay comprising:
   a conductive header;
   a triac die bonded to said header;
   a photothyristor circuit die bonded to said header, said photothyristor circuit including,
   a photodiode receiving an input signal and developing light in relation thereto, and
   first and second photothyristors cross-coupled in parallel, responsive to light developed by said photodiode,
   said photothyristor circuit being connected to said triac to gate said triac in response to said input signal, said header including a first output terminal wherein an ON voltage of said photothyristor circuit is related to an ON voltage of triac such that said triac turns ON by a gate trigger current produced when said photothyristor circuit turns ON, said triac being ON resulting in a turning OFF of said photothyristor circuit thereby preventing a continuous flow of an inrush current to said photothyristor circuit; and
   a second output terminal, said first and second output terminals being controlled in response to said input signal.

2. The relay of claim 1 further comprising means for encapsulating said header, triac and photothyristor circuit.

3. The relay of claim 1 wherein said first and second photothyristors include internal gating resistances.

4. The relay of claim 3 wherein said internal gating resistances are sufficient to stabilize operation of said photothyristor circuit and triac in combination without requiring additional limiting resistance or triac gate resistance.

* * * * *